(12) United States Patent
Wang

(10) Patent No.: US 7,235,815 B2
(45) Date of Patent: Jun. 26, 2007

(54) LED LIGHT SET

(75) Inventor: Chung-Chieh Wang, Zhonghe (TW)

(73) Assignee: Hsien-Ta Shen, Taoyuan County (TW)

( * ) Notice: Subject to any disclaimer, the term of this patent is extended or adjusted under 35 U.S.C. 154(b) by 214 days.

(21) Appl. No.: 11/056,195

(22) Filed: Feb. 14, 2005

(65) Prior Publication Data

US 2006/0180827 A1    Aug. 17, 2006

(51) Int. Cl.
*H01L 29/04*   (2006.01)
*F21V 21/00*   (2006.01)

(52) U.S. Cl. .......................... 257/74; 362/249

(58) Field of Classification Search .......... 257/74–101; 362/249–252
See application file for complete search history.

(56) References Cited

U.S. PATENT DOCUMENTS 4,546,041 A * 10/1985 Keane et al. ............... 428/372
6,541,800 B2 * 4/2003 Barnett et al. ................ 257/98
6,840,655 B2 * 1/2005 Shen .......................... 362/249
2005/0077525 A1 * 4/2005 Lynch et al. .................. 257/74

* cited by examiner

*Primary Examiner*—Cuong Nguyen
(74) *Attorney, Agent, or Firm*—Birch, Stewart, Kolasch & Birch, LLP

(57) ABSTRACT

An LED light set comprising at least one LED dice and two conductive wires covered by insulated layer, a holder is installed on the wires at every certain distance, one LED dice is installed on every holder; each of the LED dice connects to two conductive wires with very thin metal wires, every LED dice is wrapped with transparent package, the transparent package packs in the holder, LED dice, the thin metal wires and the conductive wires. Based on above description, the present invention achieves smaller in physical size, easy to manufacture at lower cost, also has pantoscopic emission, waterproof and bendable characters.

6 Claims, 4 Drawing Sheets

© LED LIGHT SET

BACKGROUND OF THE INVENTION

I. Field of the Invention

This invention relates generally to a LED light set and, more specifically, to an LED (Light Emitting Diode) light set that is smaller in physical size, easy to manufacture at lower cost, also has pantoscopic emission, waterproof and bendable characters.

II. Description of the Prior Art

Heretofore, it is known that the structure of current LED, as shown in FIG. 4, consists of a package 5 in lamp shape, two corresponding electrodes 60, 61, one of the electrodes 60 has an LED dice 1 on top, the LED dice 1 connects to the electrodes 60, 61 with very thin metal wires 30 electrically, the electrodes 60, 61 stretch down and form two pins 62, 63 that passing through the package 5 to connect to DC power.

Based on the structure described above, if these known LED's are connected together as Christmas LED light set, manufacturers have to solder one pin of each of a plurality known LED's to conductive wire of positive power, and then solder other pin to negative power, the procedure is very tedious and cost is relative high that effects market competition.

The package, electrodes and pins are all external to the conductive wires, the whole size is relatively large, installation is not easy; light from the known LED's only emits from top of the package, that limits the luminance, the outlook is not attractive, all of these causes troublesome to users.

SUMMARY OF THE INVENTION

It is therefore a primary object of the invention to provide an LED light set that is smaller in physical size, easy to manufacture at lower cost, also has pantoscopic emission, waterproof and bendable characters.

In order to achieve the objective set forth, an LED light set in accordance with the present invention comprises at least one LED dice and two conductive wires covered by insulated layer, a holder is installed on the wires at every certain distance, one LED dice is installed on every holder; each of the LED dice connects to two conductive wires with very thin metal wires, every LED dice is wrapped with transparent package, the transparent package packs in the holder, LED dice, the thin metal wires and the conductive wires.

Based on above description, the present invention achieves smaller in physical size, easy to manufacture at lower cost, also has pantoscopic emission, waterproof and bendable characters.

BRIEF DESCRIPTION OF THE DRAWINGS

The accomplishment of the above-mentioned object of the present invention will become apparent from the following description and its accompanying drawings which disclose illustrative an embodiment of the present invention, and are as follows.

DESCRIPTION OF THE PREFERRED EMBODIMENT

Figure 1:
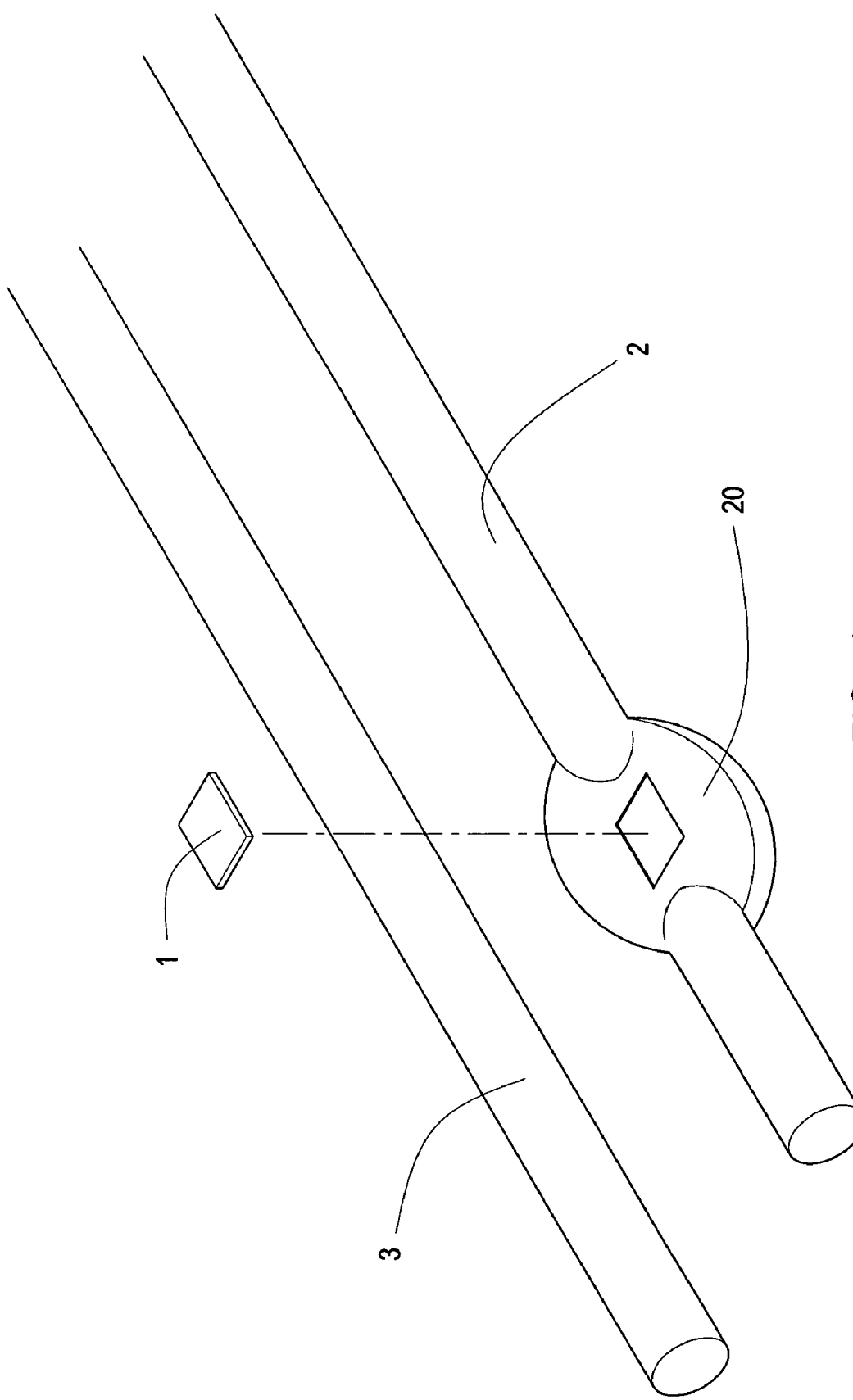
FIG. 1 is an assembly view of the present invention.
Figure 2:
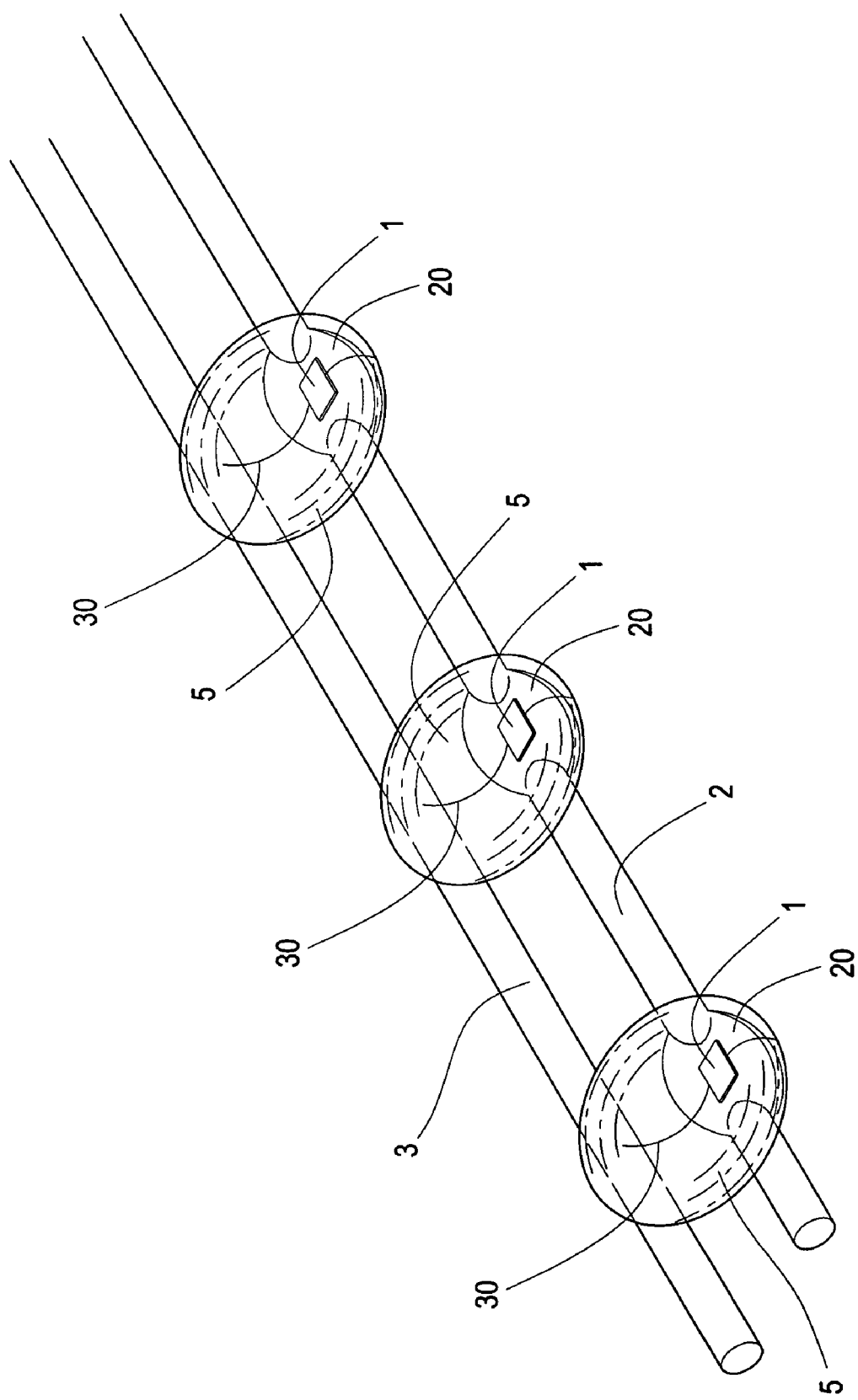
FIG. 2 is a perspective view of the present invention.

Referring to FIG. 1 and FIG. 2, the present invention comprises at least one LED dice 1 and two conductive wires 2, 3 covered by insulated layer, the major characteristic:

A holder 20 is installed on the wire 2 at every certain distance, one LED dice 1 is installed on every holder 20; each of the LED dice 1 connects to two conductive wires 2, 3 directly or with very thin metal wires 30, then every LED dice 1 is wrapped with transparent package 5, the transparent package 5 packs in the holder 20, LED dice 1, the thin metal wires 30 and the conductive wires 2, 3.

The conductive wires 2, 3 mentioned above can be enamel-insulated wire; the holders 20 are formed by tooling compression or by grinding around the enamel-insulated wires.

Figure 3:
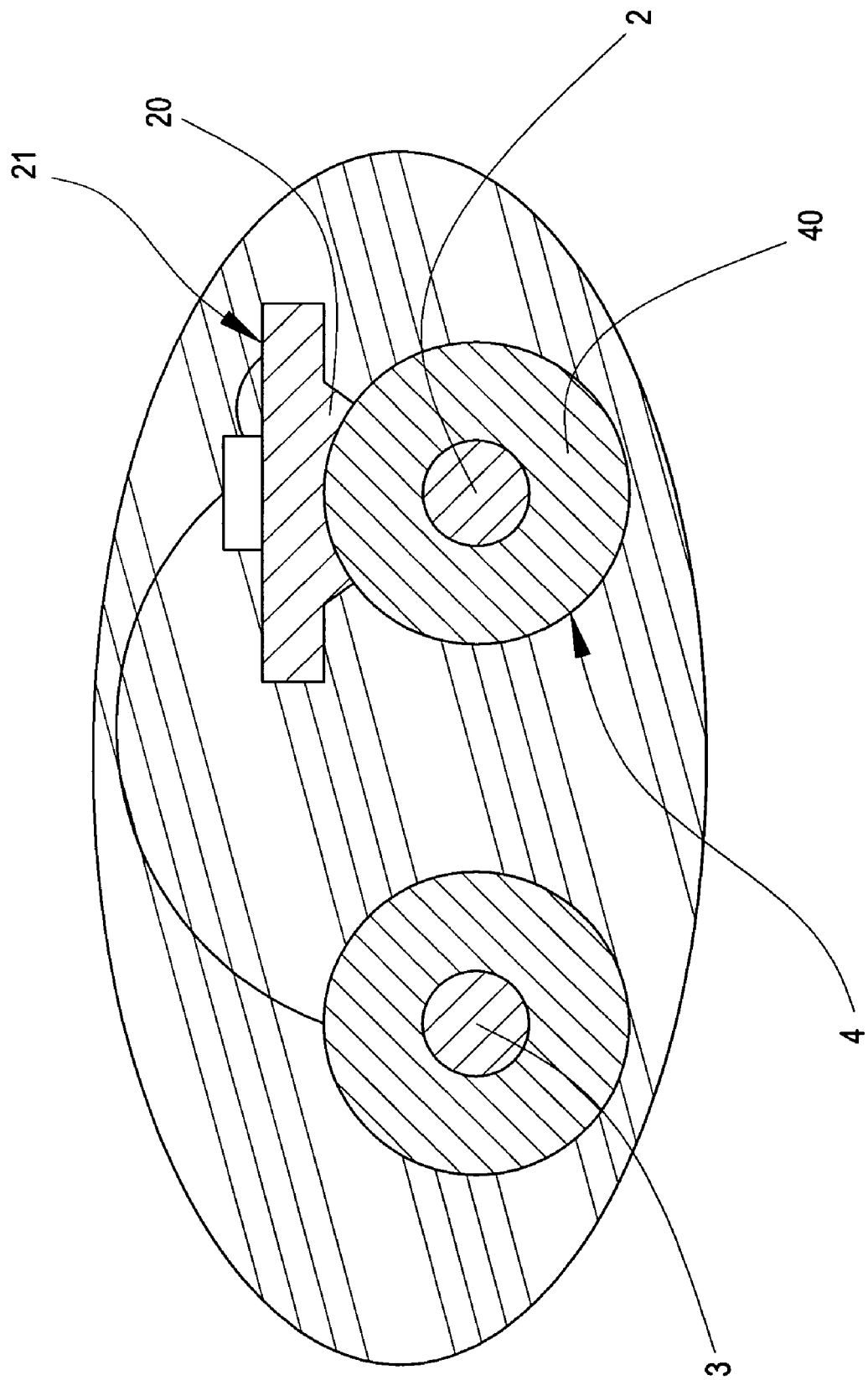
FIG. 3 is a cross-sectional view of another application of the present invention.
Figure 4:
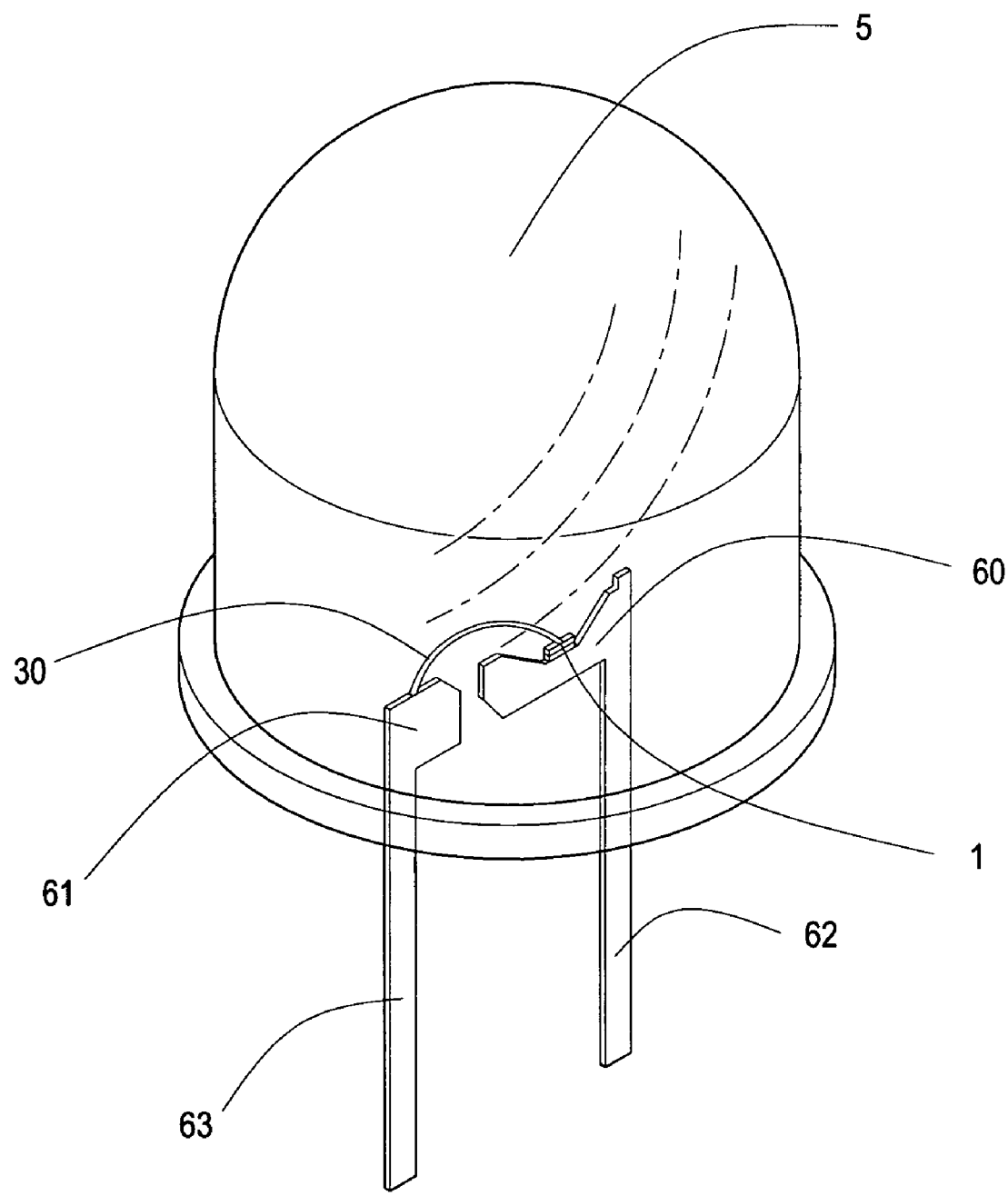
FIG. 4 is a perspective view of the prior art.

Referring to FIG. 3 again, the conductive wires 2, 3 mentioned above can also be wires 4 with insulated thin film 40, a rack 21 made of steel plate is installed at every certain distance on the wires 4, a holder 20 is installed on top of every rack 21.

Based on above description, the present invention applies package to wrap and connect LED dice, metal wires and conductive wires together to effectively reduce the physical size with waterproof character; to wrap and connect with package makes the structure of the present invention stronger and bendable at different angle and winding without damage; the present invention does not need to solder pins as prior art and can be manufactured in production line for lower manufacturing cost.

The LED dices in the present invention emit light out around the package for pantoscopic emission; the light is brighter and more beautiful.

While a preferred embodiment of the invention has been shown and described in detail, it will be readily understood and appreciated that numerous omissions, changes and additions may be made without departing from the spirit and scope of the invention.

What is claimed is:

1. An LED light set comprising:
at least one LED dice and at least two conductive wires covered by insulated layer, one of the LED dice being installed on one of said wires at every certain distance, the one of said wires being a single one-piece continuous wire, each of said LED dice connects to two said conductive wires with very thin metal wires, every said LED dice is wrapped with a transparent package, said transparent package packs in said LED dice, said thin metal wires and said conductive wires.

2. The LED light set recited in claim 1, wherein each of said LED dice connects to two said conductive wires directly.

3. The LED light set recited in claim 1, wherein said conductive wires are enamel-insulated wire.

4. The LED light set recited in claim 1, wherein said conductive wires are wires with insulated thin film.

5. The LED light set recited in claim 4, wherein a rack made of steel plate is installed at every certain distance on said wires, a holder is installed on top of every said rack.

6. The LED light set recited in claim 1, further including a holder for each of the LED dice.

* * * * *